United States Patent

Mitchell et al.

[15] 3,696,305

[45] Oct. 3, 1972

[54] HIGH SPEED HIGH ACCURACY SAMPLE AND HOLD CIRCUIT

[72] Inventors: Roy O. Mitchell, Starrucca, Pa.; Hermann Schmid, Binghamton, N.Y.

[73] Assignee: General Electric Company

[22] Filed: July 1, 1970

[21] Appl. No.: 51,552

[52] U.S. Cl. .........................330/51, 330/35, 330/16

[51] Int. Cl. ...............................................H03f 1/14

[58] Field of Search ..330/51; 307/238, 246; 328/151

[56] References Cited

UNITED STATES PATENTS 3,304,507 2/1967 Weekes et al. ............328/151

3,390,347 6/1968 Jones et al. ..................330/51

*Primary Examiner*—Nathan Kaufman

*Attorney*—Francis Richwine, Irving M. Freedman, Frank L. Neuhauser, Oscar B. Waddell and Joseph B. Forman

[57] ABSTRACT

This improved analog sample and hold circuit corrects for amplifier offset voltage and is readily adaptable to monolithic mechanization using complementary MOS techniques. Offset correction is accomplished by using a high gain differential input amplifier twice but through opposite input terminals. The amplifier offset voltage thus also occurs twice, but with opposite polarity hence eliminating itself.

2 Claims, 5 Drawing Figures

INVENTORS:
ROY O. MITCHELL,
HERMANN SCHMID,
BY Francis K Richmire
THEIR ATTORNEY.

INVENTORS
ROY O. MITCHELL,
HERMANN SCHMID,
BY
THEIR ATTORNEY.

HIGH SPEED HIGH ACCURACY SAMPLE AND HOLD CIRCUIT

BACKGROUND OF INVENTION

Analog voltages are used in many ways in computation, automation and control technologies. One specific requirement in data acquisition systems is the ability to store, for further processing or comparison, particular signal values, especially those obtained from fast moving waveforms. This can be accomplished by circuits generally referred to as sample/hold circuits. Here, an analog signal charges a capacitor, which will store the signal value for a usable time period.

Typically, prior art sample/hold circuits consist, as shown in FIG. 1, of an analog switch, a capacitor and an operational amplifier. These circuits suffer severe accuracy limitations due to non-perfect components, and speed limitations due to their inherent exponential charging characteristic. The more important deficiencies of conventional analog switches are: finite ON and OFF impedance, voltage offset and current leakage, slow rise and fall times, delays and capacitive feed through. The significant imperfections of the state of the art amplifiers are voltage and current offsets, bandwidth and slew limitations. Consequently prior art sample/hold circuits have very limited speed, accuracy and sample time/hold time ratios.

SUMMARY OF INVENTION

The sample/hold circuit of the present invention differs from prior circuits because it overcomes the voltage and current offsets inherently present in DC amplifiers. This is accomplished by using a high-gain differential input amplifier and a simple low gain inversion amplifier in such a way that the offset determining amplifier is used twice, so as to eliminate the offset voltages.

In the sample mode the differential and inversion amplifiers are used, in the hold mode only the differential amplifier is used with input through the opposite input terminal. Offset voltages in the two modes are for all practical purposes equivalent but opposite in polarity. Hence they cancel. The sample/hold circuit of this invention can also attain higher speed because the capacitor is charged linearly, as from a constant current source, and not exponentially as in prior art circuits.

The principal object of this invention is to provide a simple analog sample/hold circuit, which can be implemented economically and which is an improvement over the prior art providing increased speed and accuracy.

Another object of the invention is to provide a sample/hold circuit that does not require extremely low offset amplifiers, precision resistance and low ON-resistance analog voltage switches.

Another object of the invention is to provide a sample/hold circuit that facilitates monolithic implementation on a single chip of silicon (except C) using MOS (Metal-Oxide-Semiconductor) Techniques.

Another specific object of the invention is to provide a sample/hold circuit that when implemented with complementary MOS circuits provides simultaneously high input impedance and high speed of operation.

DESCRIPTION OF THE PREFERRED EMBODIMENT

Figure 1:
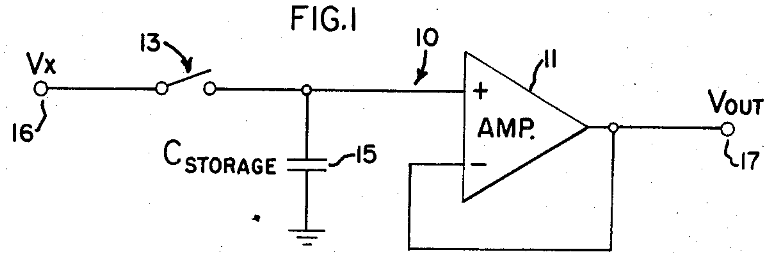
FIG. 1 is a schematic diagram of a typical implementation of a prior art sample/hold circuit.
Figure 2:
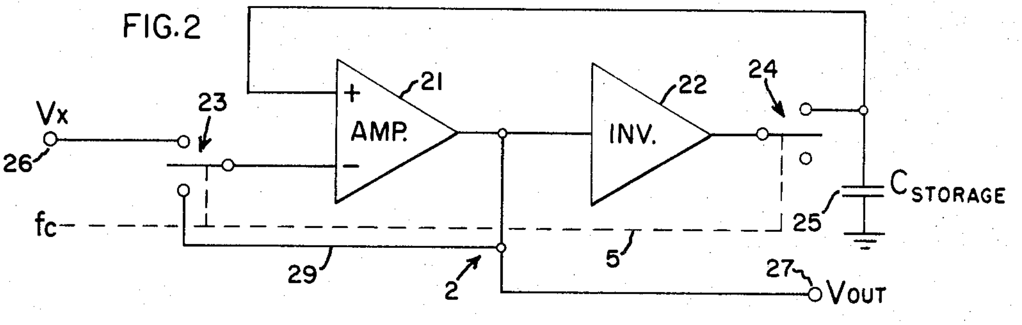
FIG. 2 is a schematic diagram of a sample/hold circuit according to the present invention.

The sample/hold circuit 2 of this invention as shown in schematic in FIG. 2 is made up of a differential input amplifier 21, an inversion amplifier 22, an analog switch 23, a series switch 24, a storage capacitor 25 and input and output terminals 26, 27, respectively. This is a modification of the prior art circuit 10 of FIG. 1 which includes only a differential amplifier 11 with feedback, analog switch 13 and capacitor 15 between terminals 16 and 17. FIG. 1 illustrates a typical prior art sample/hold circuit 10 which includes only a differential amplifier 11 with feedback, analog switch 13 and capacitor 15 between terminals 16 and 17. The sample/hold circuit of this invention can be described as a modification of that prior art circuit by reference to the circuit 2 illustrated schematically in FIG. 2. Circuit 2 is made up of a differential input amplifier 21, an inversion amplifier 22, an analog switch 23, a series switch 24, a storage capacitor 25 and input and output terminals 26, 27. The two amplifiers 21 and 22 are cascaded and the output of 21 is the input to 22. Switch 23 not only controls the input $V_x$ to the inverting terminal 28 of the differential amplifier but also permits connecting of the output of amplifier 21 to the inverting terminal 28 via 29. Switch 24 connects the output of inverter 22 to capacitor 25, the other terminal of which is grounded. The output of the sample/hold circuit $V_{out}$ is the output of the differential amplifier 21. Switches 23 and 24 when operated in concert, as by a clock pulse signal $f_c$ (switch control circuit 5) cause the circuit to operate in either of the two distinct modes, sample or hold.

Figure 3:
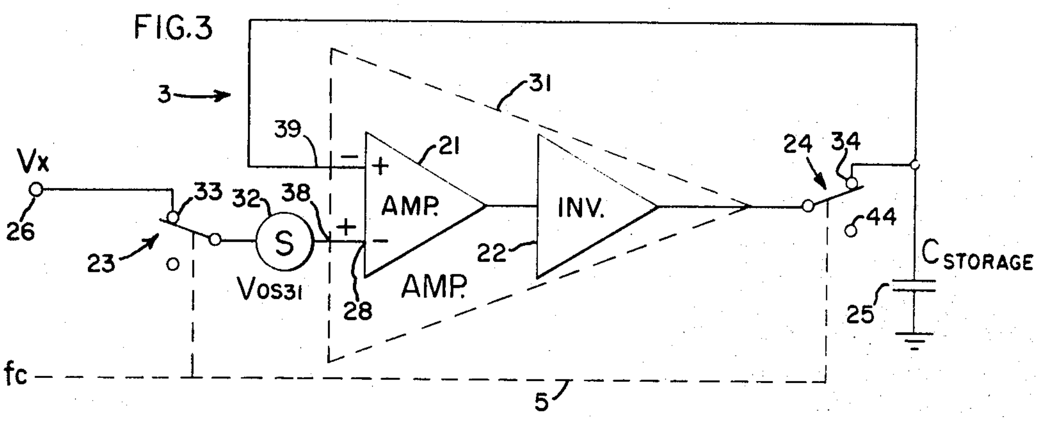
FIGS. 3 and 4 are schematics of the operational equivalents of the sample/hold circuit of the present invention as in effect during the sample and hold modes, respectively.

The operation of the sample/hold circuit in the two modes can best be explained by reference to FIGS. 3 and 4 which illustrate the circuit in FIG. 2 in each of the two modes. FIG. 3 demonstrates the operation of the sample/hold circuit in the sample mode. Here, storage capacitor 25 is charged as a result of application of $V_x$, the input voltage. Connecting switches 23 and 24 as shown schematically to contacts 33 and 34 applies $V_x$ to inverting terminal 28 of differential amplifier 21 and connects the circuit as a unity gain amplifier. The two cascaded amplifiers 21 and 22 are acting as a single amplifier illustrated schematically as 31. Because of the inversion in 22, the polarities of the input terminals of the overall amplifier 31 are the reverse of that of 21 and the input signal $V_x$ is now connected to the non-inverting input 38 of 31. The output of 31 is fed back via switch 24 to the inverting input 39. Capacitor 25 is connected to the output of amplifier 31.

Offset voltage, a natural phenomenon of differential amplifiers resulting from imperfect and mismatched components, is a significant limitation affecting accuracy in the prior art devices, as previously mentioned. The offset voltage of a DC amplifier manifests itself by a DC voltage output when there is no input signal. In practice, the offset voltage is generally attributed to the mismatch of input transistors of the amplifier and can be regarded as an extra input voltage $V_{os}$. Since a principal object of this invention is to overcome the practical limitation associated with the offset voltages of amplifiers, explanation is facilitated by the insertion of a voltage generator 32 in series with the amplifier. The output of this generator, $V_{os\text{-}31}$, represents the offset voltage of the combined amplifier 31. The output of amplifier 31 is thus $V_x + V_{os\text{-}31}$. Accordingly, capacitor 25 will charge to a potential of $V_x + V_{os\text{-}31}$.

Figure 4:
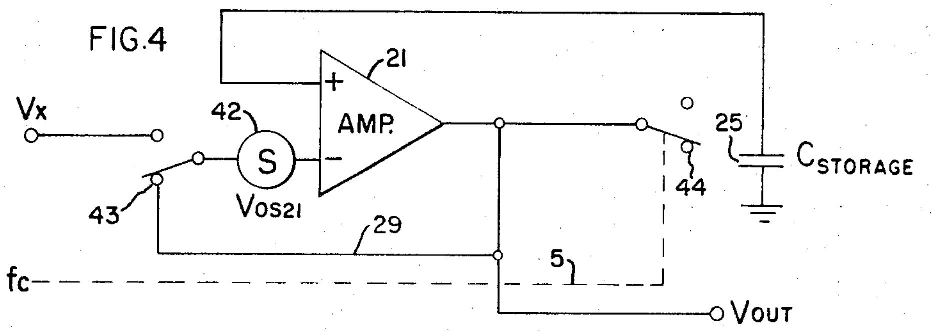

When the circuit is switched to the hold mode, it operates as a unity gain amplifier, as illustrated in FIG. 4. In this mode the circuit is comprised only of the storage capacitor 25, switches 23, 24 and amplifier 21. Capacitor 25 is connected to the non-inverting input of amplifier 21 and the output of 21 is connected via 29 to the inverting input. Therefore, the circuit is a unity gain amplifier with the capacitor voltage ($V_x + V_{os\text{-}31}$) as input. For illustration, a voltage generator 42 representing the offset voltage of amplifier 21, $V_{os21}$, is shown connected in series with the inverting input. Since the effect of the offset voltage of inversion amplifier 22 is very small, $V_{os21}$ can be assumed equal to $V_{os31}$. With these two inputs, the output of amplifier 21 in the hold mode is:

$$V_{out} - V_x + V_{os31} - V_{os21} \cong V_x$$

Thus, the sample/hold circuit of FIG. 2 corrects its own offset.

In the prior art circuit of FIG. 1, capacitor 15 is charged with the time constant RC, where C is the capacitance of capacitor 15 and R is the sum of the ON-resistance of switch 13, and the source impedance of $V_x$. The capacitor 15 thus charges according to the exponential function:

$V_c = V_x(1 - e^{-t/RC})$ To charge a capacitor to $0.9999V_x$ requires approximately ten (10) time constants RC.

Figure 5:
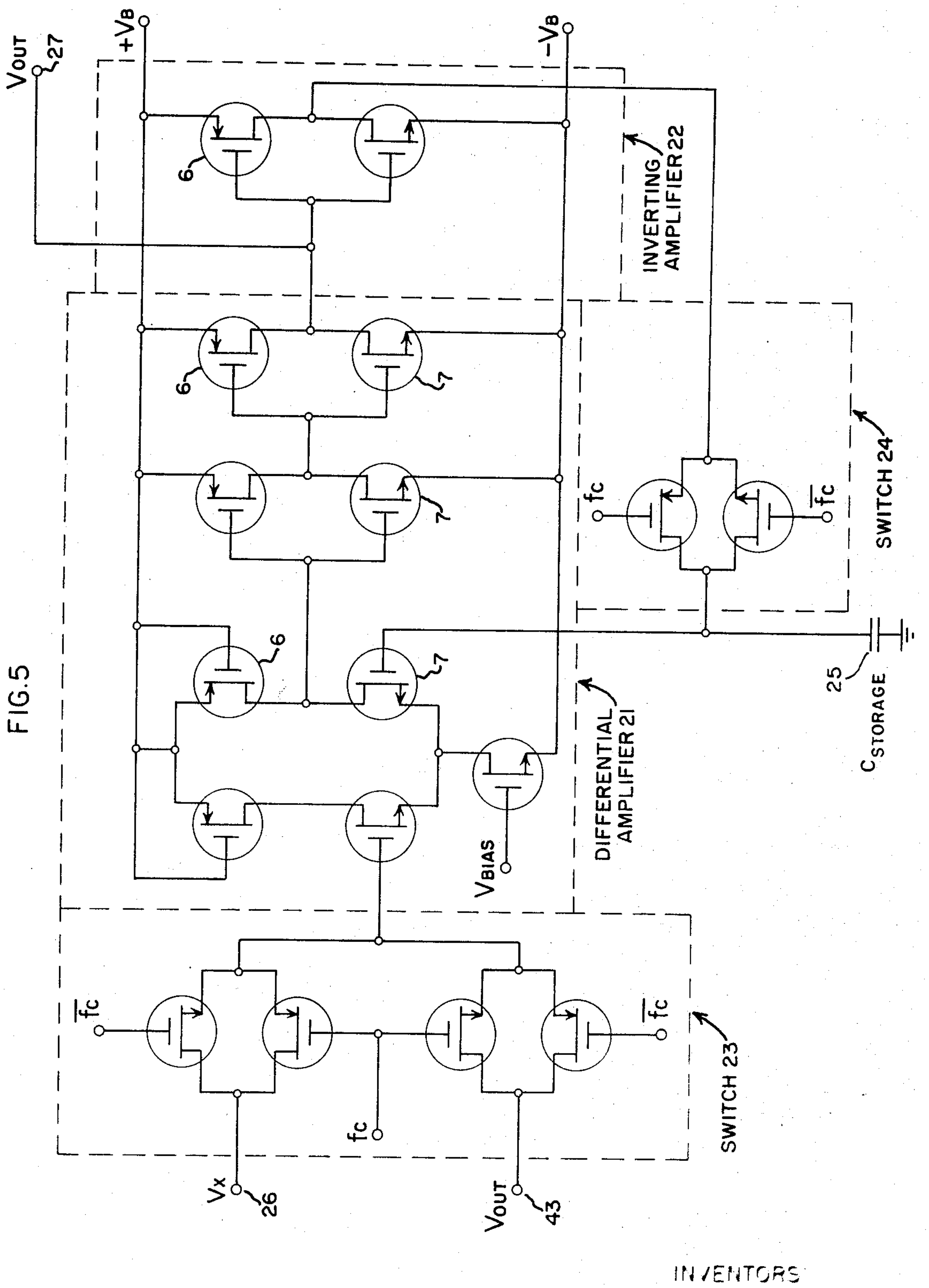
FIG. 5 is a schematic of a preferred embodiment using complementary MOS circuitry.

In the sample/hold circuit of this invention, the capacitor 25 is charged from the output of amplifier 31 which output according to the mechanization shown in FIG. 5 will be either $+V_B$ or $-V_B$ until the voltage across capacitor 25 equals $V_x$. If $V_B$ of the power supply is assumed to be considerably larger than $V_x$ the charging current $I_{ch}$ can be considered to be constant. From the equation $$I_{ch}\,t = V_x C$$

the charging time can be derived as $$t = V_x C / I_{ch}$$

This means not only that capacitor 25 can be charged considerably faster than capacitor 15 of FIG. 1, but also that the charging time of capacitor 25 is less dependent on the ON resistance of the analog switch and the source impedance of $V_x$.

One principal advantage of the sample/hold circuit of this invention is that both the analog switch and the two amplifiers can be implemented monolithically on a single chip of silicon. The circuit can be implemented with either conventional bipolar or complementary MOS (C-MOS) integrated circuit techniques. Employing the C-MOS technique offers several advantages over the bipolar IC technique.

FIG. 5 depicts a preferred implementation of the invention using complementary (p-channel and n-channel metal oxide semiconductor field effect transistors) MOS techniques. The switch, amplifier and capacitor elements are assigned reference numbers corresponding to the illustrative schematics in FIGS. 2, 3 and 4. The switching circuit 5 is represented by the terminals indicated for activation by $f_c$ and $\bar{f}_c$, the switching signals. If the power source indicated as $+V_B$ and $-V_B$ is a DC voltage on the order of +7.5V and −7.5V, the system can be adequately implemented to handle the signal voltages (of the order of ±5 volts) ordinarily used in analog computing circuitry. The FIG. 5 implementation also demonstrates that the power source $+V_B$, $-V_B$ being independent of the input voltage $V_x$ can be made sufficiently larger than $V_x$ to permit the linear charging referred to previously.

The foregoing discloses and describes a novel sample/hold circuit which produces a better result than those of the prior art and an explicit implementation of the circuit that is particularly adapted to recent developments in the technology of electronic manufacturing. Modifications and applications of the preferred embodiments are possible without departure from the invention itself as defined in the claims.

We claim:

1. A sample/hold circuit:

a. an input terminal;

b. a high gain differential amplifier having inverting and non-inverting terminals;

c. an input switch connected to the inverting input terminal of said amplifier for selectively connecting said amplifier either to said input terminal or to the output of said differential amplifier to connect said circuit in sample or hold mold;

d. a low gain inverting amplifier cascaded with said differential amplifier whereby the output of said differential amplifier is coupled to the input of said inverting amplifier;

e. a storage capacitor connected between ground and the non-inverting input terminal of said differential amplifier;

f. a second switch reconnecting the output of said inverting amplifier to the connection between said capacitor and said non-inverting differential amplifier input terminal in the sample mold;

g. an output terminal connected to the output of said differential amplifier; and h. circuit means for selectively activating said first and second switches to connect said input terminal to said inverting terminal through said first switch and the output of the inverting amplifier to said capacitor through said second switch to cause charging of said capacitor in said sample mold to a stored voltage proportional to the input voltage and the offset voltage of said differential amplifier and to disconnect the input terminal from said inverting terminal and to connect the output of the differential amplifier to said inverting terminal through said first switch, and to disconnect the output of said inverting terminal from said capacitor through said second switch while in the hold mold so that the stored voltage is applied to the non-inverting terminal and the offset voltage of the differential amplifier to the inverting terminal whereby the offset voltage associated with said differential amplifier is effectively cancelled.

2. A sample/hold circuit comprising:

a. an input terminal for receiving an analog input signal;

b. a high gain differential amplifier having an inverting input terminal and a non-inverting terminal;

c. a low gain inverting amplifier;

d. means coupling the output of said differential amplifier to the input of said inverting amplifier;

e. a storage capacitor;

f. means coupling the capacitor between the non-inverting input terminal of said differential amplifier and a point of reference potential;

g. a first analog switch means for alternately connecting said input terminal and the output of said differential amplifier to the inverting terminal of said differential amplifier as the circuit is alternately operated in the sample or hold molds;

h. a second analog switch means for alternately connecting and disconnecting the output of the inverting amplifier and the junction of the storage capacitor and the non-inverting input terminal;

i. mold selecting means to actuate said first and second switches to couple the input terminal to said inverting terminal through said first switch and the output of inverting amplifier to said capacitor through said second switch in the sample mold to cause charging of said capacitor in said sample mold to a stored voltage proportional to the input voltage and the offset voltage of said differential amplifier and to actuate said first and second switches to connect the output of said differential amplifier to the inverting terminal through said first switch and to disconnect the output of said inverting amplifier from said storage capacitor through said second switch during the hold mold whereby the stored voltage proportional to the input voltage and the offset voltage is applied to the non-inverting terminal and the offset voltage to the inverting terminal so that the offset voltage associated with said differential amplifier is cancelled.

* * * * *